United States Patent [19]

Lin

[11] Patent Number: 5,830,800
[45] Date of Patent: Nov. 3, 1998

[54] PACKAGING METHOD FOR A BALL GRID ARRAY INTEGRATED CIRCUIT WITHOUT UTILIZING A BASE PLATE

[75] Inventor: Ting-hao Lin, Taoyuan Hsien, Taiwan

[73] Assignee: Compeq Manufacturing Company Ltd., Taoyuan Hsien, Taiwan

[21] Appl. No.: 839,395

[22] Filed: Apr. 11, 1997

[51] Int. Cl.⁶ .............................. H01L 21/30; H01L 21/46
[52] U.S. Cl. ......................... 438/459; 438/612; 438/613; 438/614; 438/615; 438/616; 438/617; 438/977
[58] Field of Search .................................. 438/612–617, 438/485, 459, 977; 257/737, 738; 228/180.22

[56] References Cited

U.S. PATENT DOCUMENTS 5,620,928  4/1997  Lee et al. ................................. 438/118
5,656,550  8/1997  Tsuji et al. .............................. 438/123

Primary Examiner—David Graybill
Assistant Examiner—David A. Zarneke
Attorney, Agent, or Firm—Michael A. O'Neil

[57] ABSTRACT

A packaging method for a ball grid array (BGA) integrated circuit (IC) without utilizing a base plate as a supporting plate, and therefore reducing the thickness of the packaged BGA IC. In the method, a copper sheet is used as a supporting plate first. After resin is applied to coat a chip implanted on the copper sheet and connecting wires thereof has hardened, the hardened resin is sufficiently firm to support the IC, so the copper sheet can be etched. Accordingly, a base plate is not necessary.

7 Claims, 1 Drawing Sheet

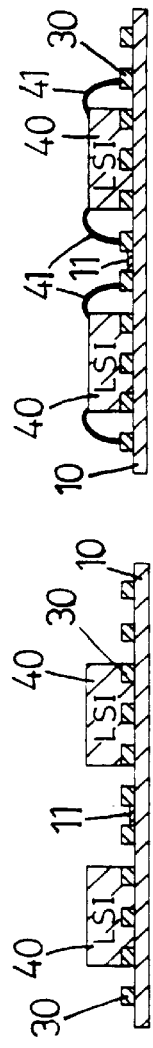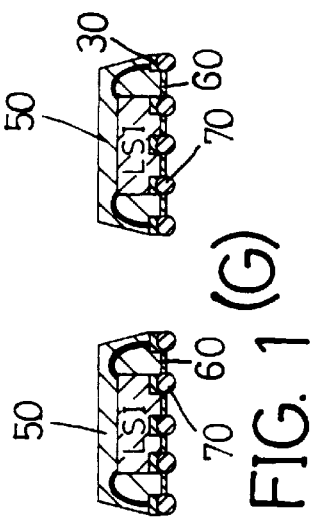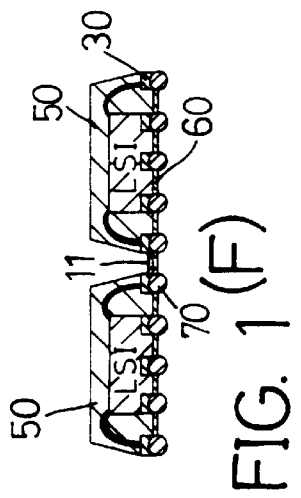

PACKAGING METHOD FOR A BALL GRID ARRAY INTEGRATED CIRCUIT WITHOUT UTILIZING A BASE PLATE

BACKGROUND OF THE INVENTION

1. Field of the Invention

The present invention relates to a packaging method for a ball grid array (BGA) integrated circuit (IC), more particularly, to a packaging method for a BGA IC without utilizing a base plate, thereby allowing a packaged IC to have a very small thickness.

2. Description of Related Art

Nowadays, there are various methods for packaging ICs, wherein a method called BGA (ball grid array) is a packaging method for an IC without a lead frame. A conventional BGA packaging method comprises steps of providing a chip on an upper surface of a base plate (e.g. a circuit board), drawing wires extending from terminals of the IC through the base plate and to a bottom surface thereof, and providing a solder ball for each of the wires, wherein the solder balls are arranged as an array on the bottom surface of the base plate. It is necessary for such a method to provide the base plate as a supporting plate to carry the chip and the solder balls. However, such a packaged IC with a base plate has a considerable thickness, thereby occupying a sizable space when being applied to a small-sized device such as a notebook computer or a sub-notebook computer.

SUMMARY OF THE INVENTION

One object of the present invention is to provide an improved packaging method for a BGA IC without utilizing a base plate as a supporting plate, and therefore reducing the thickness of the packaged BGA IC.

In accordance with one aspect of the present invention, the packaging method for a BGA IC comprises the steps of forming circuits on a copper sheet; implanting chips on the copper sheet; connecting wires between terminals of the chip and the circuits on the copper sheet; applying resin to protect the chip and wires; etching the copper sheet to expose the circuits thereon after the resin has hardened; applying antioxidation coating to protect all the exposed portions except for positions to be provided with solder balls; implanting solder balls to the appropriate positions; and dividing the resultant product into separate ICs.

In this method, the copper sheet is used as a supporting plate first. After the applied resin has hardened, the hardened resin is sufficiently firm to support the IC, so the copper sheet can be etched. Accordingly, a base plate is not necessary for the method of the present invention.

Other objects, advantages and novel features of the invention will become more apparent from the following detailed description when taken in conjunction with the accompanying drawings.

BRIEF DESCRIPTION OF THE DRAWINGS

FIGS. 1(A) to 1(G) show the process of the packaging method for a BGA IC in accordance with the present invention.

DETAILED DESCRIPTION OF PREFERRED EMBODIMENT

An embodiment of the present invention in which only two ICs are simultaneously produced is described below for the sake of simplification. However, it is appreciated that the present invention can be applied to manufacture a number of ICs simultaneously by one flow of the process.

Referring to FIGS. 1(A) and 1(B), a thin copper sheet 10 is prepared first, and a dry film 20 is provided to cover the copper sheet 10. The dry film 20 is patterned so that portions of the copper sheet 10 to be formed with two circuits are exposed, wherein each of the circuits is respectively used for one of the two chips. Metal is electroplated to the exposed portion of the copper sheet 10 and the dry film 20 is removed to form projections 30 shown in FIG. 1(B). Reference number 11 indicates a connecting link between the two circuits. Two chips 40 are then implanted on the copper sheet 10.

Subsequentially, referring to FIG. 1(C), terminals of the chips 40 are electrically connected with the appropriate projections 30 on the copper sheet 10 by gold wires 41.

Next, resin 50 is applied to coat the chips 40 and wires 41, as shown in FIG. 1(D). After the resin 50 has hardened, the copper sheet 10 is etched, see FIG. 1(E). An antioxidation coating 60 is provided to a bottom of the product of FIG. 1(E) except for the positions of the electroplated projections. A solder ball 70 is implanted to each of the exposed electroplated projections, as shown in FIG. 1(F).

The connecting link 11 is etched so the resultant product of FIG. 1(F) is divided into two separate packaged ICs, as shown in FIG. 1(G). The packaged ICs can be provided with another antioxidation coating (not shown) to protect the separate ICs.

As described above, the copper sheet 10 is used as a supporting plate to carry the circuits (electroplated projections 30), the chips 40 and the wires 41. After the applied resin 50 has hardened and is firm enough to support the elements, the copper sheet 10 is etched then. Accordingly, the packaging method of the present invention needs no base plate from the beginning to the end.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A packaging method for a ball grid array (BGA) integrated circuit (IC) without utilizing a base plate comprising steps of:

preparing a copper sheet;

covering a patterned dry film to said copper sheet;

electroplating metal to portions of said copper sheet exposed from said patterned dry film to form at least one circuit and removing said dry film;

implanting at least one chip to said copper sheet;

electrically connecting terminals of said at least one chip with said at least one circuit by wires;

applying resin to coat said at least one chip;

etching said copper sheet after said resin has been hardened to expose said circuit; and implanting solder balls to contact positions of said circuit.

2. The method according to claim 1, wherein said step of implanting chip implants a plurality of chips on said copper sheet, said step of electroplating metal to said copper sheet forms a corresponding number of circuits, and there is a connecting link between every two circuits.

3. The method according to claim 2, further comprising a step of etching said connecting links to form individually separate ICs after said step of implanting solder balls.

4. The method according to claim 3, further comprising a step of applying an antioxidation coating to said separate ICs after said connecting links are etched.

5. The method according to claim 1, further comprising a step of applying an antioxidation coating to said exposed circuits except for the positions to be implanted with solder balls after said copper sheet is etched.

6. The method according to claim 1, wherein said electroplated circuits are projected from said copper sheet.

7. The method according to claim 1, wherein said wires connecting said terminals of said at least one chip with said at least one circuit are gold wires.

* * * * *